US009637391B2

(12) United States Patent
Yu et al.

(10) Patent No.: US 9,637,391 B2
(45) Date of Patent: May 2, 2017

(54) CRYSTALLINE SILICON INGOT INCLUDING NUCLEATION PROMOTION LAYER

(71) Applicant: Sino-American Silicon Products Inc., Hsinchu (TW)

(72) Inventors: Wen-Huai Yu, Hsinchu (TW); Cheng-Jui Yang, Hsinchu (TW); Yu-Min Yang, Hsinchu (TW); Kai-Yuan Pai, Hsinchu (TW); Wen-Chieh Lan, Hsinchu (TW); Chan-Lu Su, Hsinchu (TW); Yu-Tsung Chiang, Hsinchu (TW); Sung-Lin Hsu, Hsinchu (TW); Wen-Ching Hsu, Hsinchu (TW); Chung-Wen Lan, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 514 days.

(21) Appl. No.: 14/154,497

(22) Filed: Jan. 14, 2014

(65) Prior Publication Data

US 2014/0127496 A1 May 8, 2014

Related U.S. Application Data

(62) Division of application No. 13/416,525, filed on Mar. 9, 2012.

(30) Foreign Application Priority Data

Nov. 28, 2011 (TW) .............................. 100143484 A

(51) Int. Cl.
*C30B 29/06* (2006.01)
*C01B 33/02* (2006.01)
(Continued)

(52) U.S. Cl.
CPC ............ *C01B 33/02* (2013.01); *C30B 11/002* (2013.01); *C30B 11/006* (2013.01); *C30B 29/06* (2013.01);
(Continued)

(58) Field of Classification Search
CPC ....... C30B 11/00; C30B 11/006; C30B 11/14; C30B 29/00; C30B 29/02; C30B 29/06;
(Continued)

(56) References Cited

U.S. PATENT DOCUMENTS

2007/0169685 A1* 7/2007 Stoddard ................. C30B 11/00
117/13
2009/0000536 A1 1/2009 Fujiwara et al.
(Continued)

FOREIGN PATENT DOCUMENTS

CN 101164173 A 4/2008
CN 101864594 A 10/2010
(Continued)

OTHER PUBLICATIONS

Written Opinion issued in corresponding Singaporean Application No. 201207876-2 dated Mar. 17, 2016 (8 pages).

*Primary Examiner* — Kenneth A Bratland, Jr.
(74) *Attorney, Agent, or Firm* — Osha Liang LLP

(57) ABSTRACT

A crystalline silicon ingot and a method of fabricating the same are provided. The method utilizes a nucleation promotion layer to facilitate a plurality of silicon grains to nucleate on the nucleation promotion layer from a silicon melt and grow in a vertical direction into silicon grains until the silicon melt is completely solidified. The increment rate of defect density in the silicon ingot along the vertical direction has a range of 0.01%/mm~10%/mm.

15 Claims, 9 Drawing Sheets

(51) Int. Cl.
*C30B 11/00* (2006.01)
*H01L 31/18* (2006.01)

(52) U.S. Cl.
CPC .......... *H01L 31/182* (2013.01); *Y02E 10/546* (2013.01); *Y02P 70/521* (2015.11); *Y10T 428/259* (2015.01)

(58) Field of Classification Search
CPC .. H01L 31/182; Y10T 428/259; Y02P 70/521; Y02E 10/546
USPC .............. 117/11, 73, 81, 83, 902, 928, 931; 164/122, 122.1, 125; 423/324, 348–349
See application file for complete search history.

(56) References Cited

U.S. PATENT DOCUMENTS

| | | | |
|---|---|---|---|
| 2009/0047203 A1* | 2/2009 | Mueller | C30B 29/06 423/348 |
| 2010/0127221 A1 | 5/2010 | Weinert et al. | |
| 2011/0108108 A1 | 5/2011 | Im et al. | |
| 2011/0203517 A1* | 8/2011 | Freudenberg | C01B 33/02 117/81 |

FOREIGN PATENT DOCUMENTS

| | | |
|---|---|---|
| CN | 101971293 A | 2/2011 |
| EP | 1876650 A1 | 1/2008 |
| JP | 2008063194 A | 3/2008 |
| WO | 2007084934 A2 | 7/2007 |
| WO | 2011037343 A2 | 3/2011 |

\* cited by examiner

CRYSTALLINE SILICON INGOT INCLUDING NUCLEATION PROMOTION LAYER

CROSS-REFERENCE TO RELATED APPLICATION

This application is a divisional application of U.S. utility application Ser. No. 13/416,525 and hereby claims all benefits of U.S. utility application Ser. No. 13/416,525, which claims priority to Taiwan application serial number 100143484, filed Nov. 28, 2011. The above applications are hereby incorporated by reference in their entireties.

BACKGROUND OF THE INVENTION

Field of the Invention

The invention relates to a crystalline silicon ingot and a fabricating method thereof, and particularly to a crystalline silicon ingot having a low bulk defect density and small-sized silicon grains at the bottom thereof by using a nucleation promotion layer and a fabricating method thereof.

Description of the Prior Art

Most of the solar cells produce a photovoltaic (PV) effect when absorbing sunlight. Currently, the solar cell is made of a silicon-based material, since for the most parts, silicon is the second most abundant and accessible element in the world. Also, silicon is cost-effective, nontoxic, and chemically stable, and becomes broadly used in semiconductor applications.

There are three kinds of silicon-based materials for fabricating solar cells, i.e., single-crystal silicon (mono-Si), polysilicon (poly-Si), and amorphous silicon (a-Si). Poly-Si is much less expensive than mono-Si when produced by Czochralski method (CZ method) or floating zone method (FZ method), so it is usually used as a raw material of the solar cell due to the economic concern.

Conventionally, poly-Si for solar cells is fabricated by a common casting process. That is, it is prior art to produce poly-Si for solar cells by a casting process. In brief, the poly-Si solar cell is fabricated by melting high purity silicon in a mold like quartz crucible, then cooling with a controlled solidification to form a poly-Si ingot, followed by slicing it into wafers that fit compactly into a PV cell module for further application. The ingot formed by the above process is in fact in the form of an aggregation of silicon crystals having random crystal orientations.

It's difficult to texture (roughen) the surface of the poly-Si chip due to the random crystal orientations of grains. Surface texturing can enhance the efficiency of the PV cell by reducing light reflection and thus increasing solar energy absorption on the surface of the cell. In addition, "kinks" that form in the boundaries between the grains of conventional multi-crystalline silicon tend to nucleate structural defects in the form of clusters or lines of dislocations. These dislocations, and the impurities tended to be attracted by dislocations, are believed to cause a fast recombination of electrical charge carriers in a photovoltaic cell made from conventional multi-crystalline silicon, reducing the power output of the solar cell. Thus, the poly-Si PV cell usually has lower efficiency than the equivalent mono-Si PV cell, even a radial distribution of defects exists in the latter manufactured by the current technique. However, because of the relatively simple fabricating process and lower cost for the poly-Si solar cell and also the effective defect passivation step in processing the solar cell, poly-Si is still more broadly used as the silicon source of the PV cell.

Currently, it has been developed that crystalline silicon ingot is fabricated using a mono-Si seed layer and based on directional solidification, in which a large-sized, (100)-oriented mono-Si cubic is generally employed as a seed. Unfortunately, during the competition among the (100)-oriented grain and the random nucleation grain, the latter is prevailing. For maximizing the seeded crystalline volume in an ingot, the current technique takes advantage of the boundaries in (111)-oriented silicon to surround the regions occupied by the (100)-oriented silicon seeds, thereby impeding successfully the growth of crystals having other orientations. In this way, a high quality ingot of mono-Si or bi-crystal silicon block may be obtained, in which the lifetime of the minority charge carriers is maximized in the resultant wafer employed for fabricating the high-performance solar cell. Herein, the term "single crystal silicon (mono-Si)" is referred to a bulk of mono-Si that has a single uniform crystal orientation throughout the bulk, while the term "bi-crystal silicon" is referred to a silicon bulk that has one uniform crystal orientation in or over 50% of the volume of the bulk, and has another uniform crystal orientation in the rest of the volume of the bulk. For example, such bi-crystal silicon may include a body of single crystal silicon having one crystal orientation next to another body of single crystal silicon having a different crystal orientation making up the balance of the volume of crystalline silicon. Additionally, conventional multi-crystalline silicon refers to crystalline silicon having cm-scale grain size distribution, with multiple randomly oriented crystals located within a body of silicon. However, the crystalline silicon ingot fabricated by the current technique described above where the expensive mono-Si is used as a seed is rather costly.

There are other techniques without using expensive mono-Si as a seed. Laterally grown crystals are spread over the bottom of the crucible by partial undercooling first, and then columnar crystals are grown upwards. The large-sized silicon grains of thus obtained ingots have a low bulk defect density. Therefore, the solar cell made from silicon wafers sliced from the crystalline silicon ingot fabricated by the above techniques may have higher photoelectric conversion efficiency.

However, the above current techniques using poly-Si are only proved successful in the laboratory, while in an industrial level production, it's usually more difficult to perform the poly-Si casting by controlling the growth of the dendrites to be spread over the bottom of the crucible using partial undercooling. Industrial-scale multi-crystalline silicon casting is affected by the heating uniformity of the crucible and the entirety, which increases variance of the initial undercooling controlling. Therefore, the poly-Si at the bottom of the crucible tends to grow into a large-sized grain and the defect density in this area will become elevated. The defect density becomes higher rapidly as the large-sized grains proceed to grow, resulting in poor quality of the entire crystalline silicon ingot and the solar cell with reduced photoelectric conversion efficiency.

SUMMARY OF THE INVENTION

In view of the forgoing problems, the invention discloses a crystalline silicon ingot having a low bulk defect density and small-sized silicon grains at the bottom thereof and a method of fabricating the crystalline silicon ingot in which a nucleation promotion layer is used for facilitating the nucleation of silicon grains.

In one aspect of the invention, a method of fabricating the crystalline silicon ingot includes the following steps. As a first step, a nucleation promotion layer is loaded onto a bottom of a mold, and the mold itself defines a vertical direction. Next, a silicon source is provided on the nucleation promotion layer in the mold, followed by heating the mold until the silicon source is melted into a silicon melt completely. Then, at least one thermal control parameter regarding the silicon melt is controlled to enable a plurality of silicon grains from the silicon melt to nucleate on the nucleation promotion layer such that a final average grain size of silicon grains grown in the vertical direction is about two to three-fold of an initial average grain size grown. As the final step, the at least one thermal control parameter is proceed to be controlled for growing the plurality of the silicon grains in the vertical direction until the silicon melt is solidified completely to obtain the crystalline silicon ingot.

In one preferred embodiment, the nucleation promotion layer functions to inhibit the increase of the defect density of the plurality of the silicon grains during the growth process. The defect density's increment rate of thus obtained silicon crystalline ingot in the vertical direction ranges from 0.01%/mm to 10%/mm.

In another preferred embodiment, the silicon grains that are immediately adjacent to the nucleation promotion layer have an average grain size of less than about 10 mm.

In still another preferred embodiment, the nucleation promotion layer is composed of a plurality of crystal particles with random geometry, each of which has a grain size of less than about 50 mm.

In further another preferred embodiment, the plurality of the crystal particles are poly-Si particles, mono-Si particles, single crystal silicon carbide or other crystal particles having a melting point higher than 1400° C. and capable of facilitating nucleation.

In yet another preferred embodiment, the nucleation promotion layer is a plate made of a material having a melting point higher than about 1400° C. The interface between the plate and the silicon melt has a roughness of 300 m to 1000 m to provide multiple nucleation sites for the plurality of the silicon grains.

As another preferred embodiment, a heater is located above the mold, and a directional solidification block is located below the mold. The at least one thermal control parameter may be for example a first temperature gradient from the heater to the mold, a second temperature gradient from the bottom of the silicon melt to the top of the directional solidification block or a heat transfer flux.

In another aspect of the invention, a method of fabricating the crystalline silicon ingot includes the following steps. As a first step, a nucleation promotion layer is loaded onto a bottom of a mold, wherein the nucleation promotion layer is formed by jointing a plurality of crystal particles with random geometry together and the mold itself defines a vertical direction. Next, a silicon source is provided on the nucleation promotion layer in the mold, followed by heating the mold until the silicon source is melted into a silicon melt completely. Then, at least one thermal control parameter regarding the silicon melt is controlled to enable a plurality of silicon grains from the silicon melt to nucleate on the nucleation promotion layer such that a final average grain size of silicon grains grown in the vertical direction is about two to three-fold of an initial average grain size grown. As the final step, the at least one thermal control parameter is proceed to be controlled for growing the plurality of the silicon grains in the vertical direction until the silicon melt is solidified completely to obtain the crystalline silicon ingot.

The crystalline silicon ingot of the invention includes a plurality of silicon grains grown in a vertical direction of the ingot itself and a nucleation promotion layer at the bottom thereof. Besides, the silicon grains that are immediately adjacent to the nucleation promotion layer have an average grain size of less than about 10 mm.

Contrary to prior art where expensive mono-Si seeds and partial undercooling are involved to form silicon grains on the bottom of the crucible, the invention provides the silicon melt with dense nucleation sites by using the nucleation promotion layer with lower cost. A high-density grain distribution is achieved to inhibit the generation of a certain fast-grown orientations, thereby greatly decreasing the distribution ratio of large-sized silicon grains. Since the competition is much less frequently occurred between small-sized grains during the growth process, and small-sized grains tend to grow upward in a generally single direction due to great denseness in grain population, the situation that the small-sized grains are overwhelmed by the large-sized grains is effectively diminished so that the columnar crystals are allowed to grow completely. In addition, during the growth of the crystals, the grain boundaries distributed densely in the ingot of the invention by stress field thereof attract defects to agglomerate or to slip on the grain boundaries to release thermal stress. Accordingly, the increase of defects such as dislocation is hindered effectively, thereby leading to a better quality of the crystalline silicon ingot and a higher photoelectric conversion efficiency of the solar cell made therefrom.

The characteristics, realization and functions of the invention are disclosed in the following description with reference to the preferred exemplified embodiments and the accompanying drawings.

BRIEF DESCRIPTION OF THE DRAWINGS

These and other features and advantages of the various embodiments disclosed herein will be better understood with respect to the following description and drawings, in which like reference numerals refer to like parts throughout, and in which.

DETAILED DESCRIPTION OF THE INVENTION

Figure 1A:
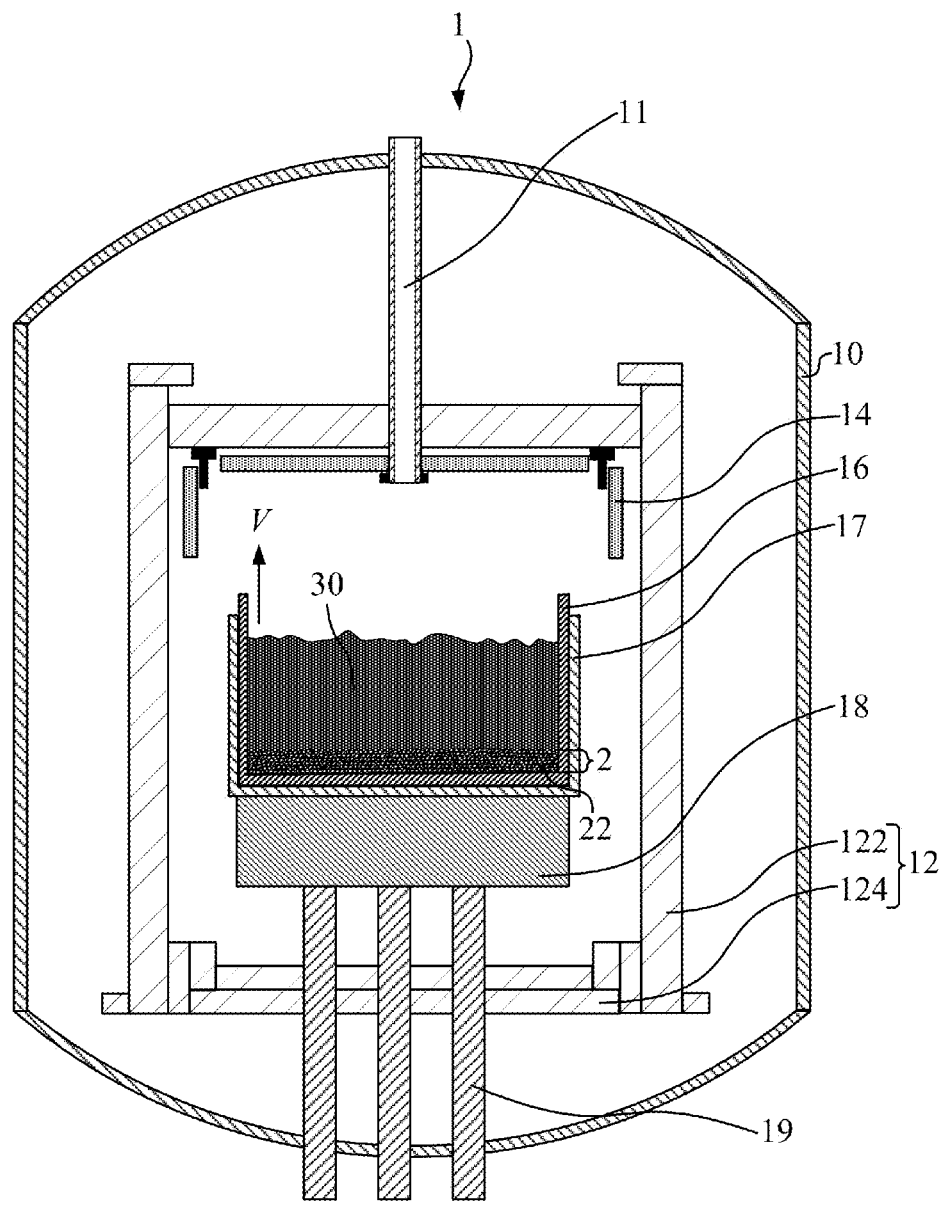
FIGS. 1A-1C are schematically a sectional view of a method for fabricating a crystalline silicon ingot according to one preferred embodiment of the invention.
Figure 1B:
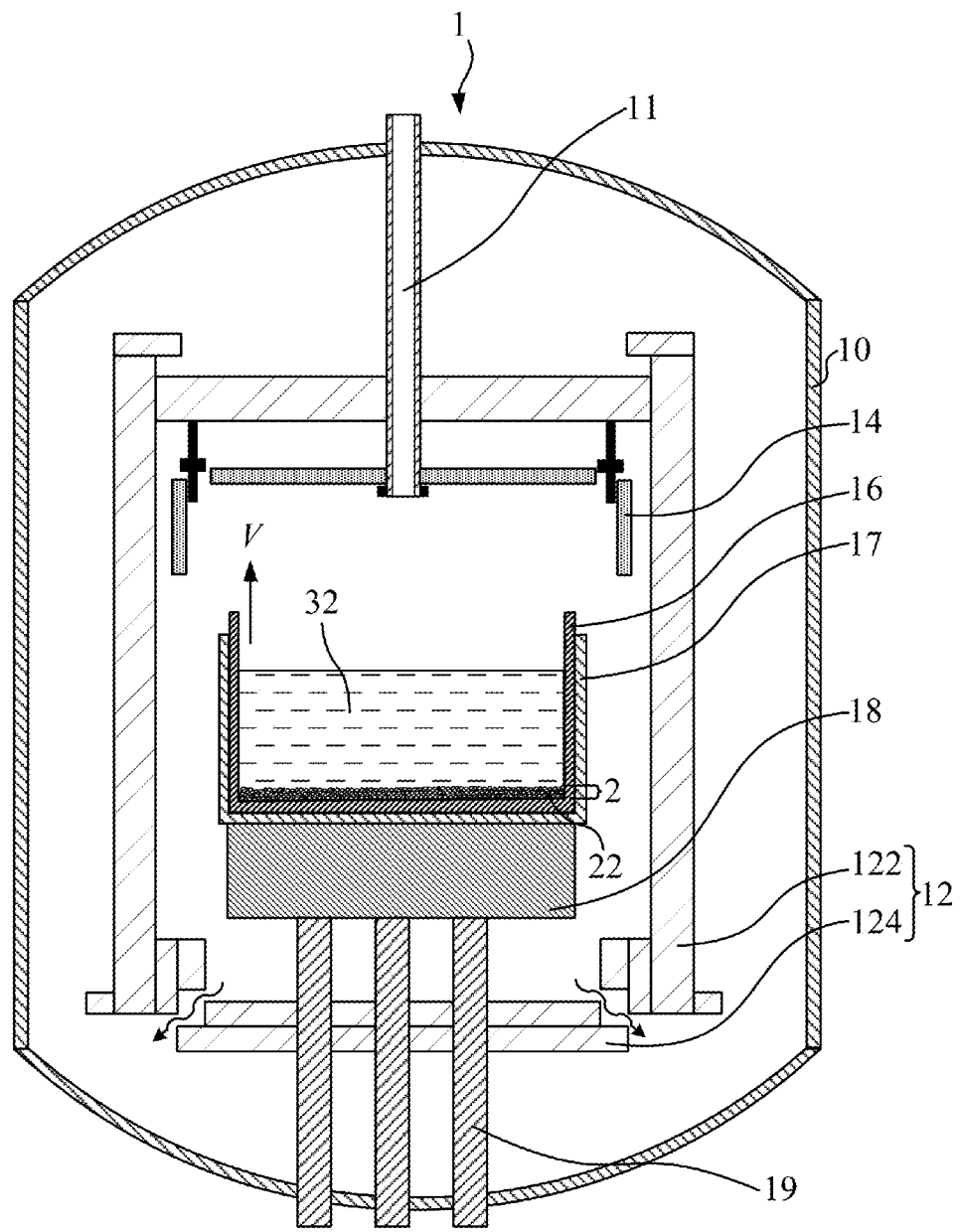
Figure 1C:
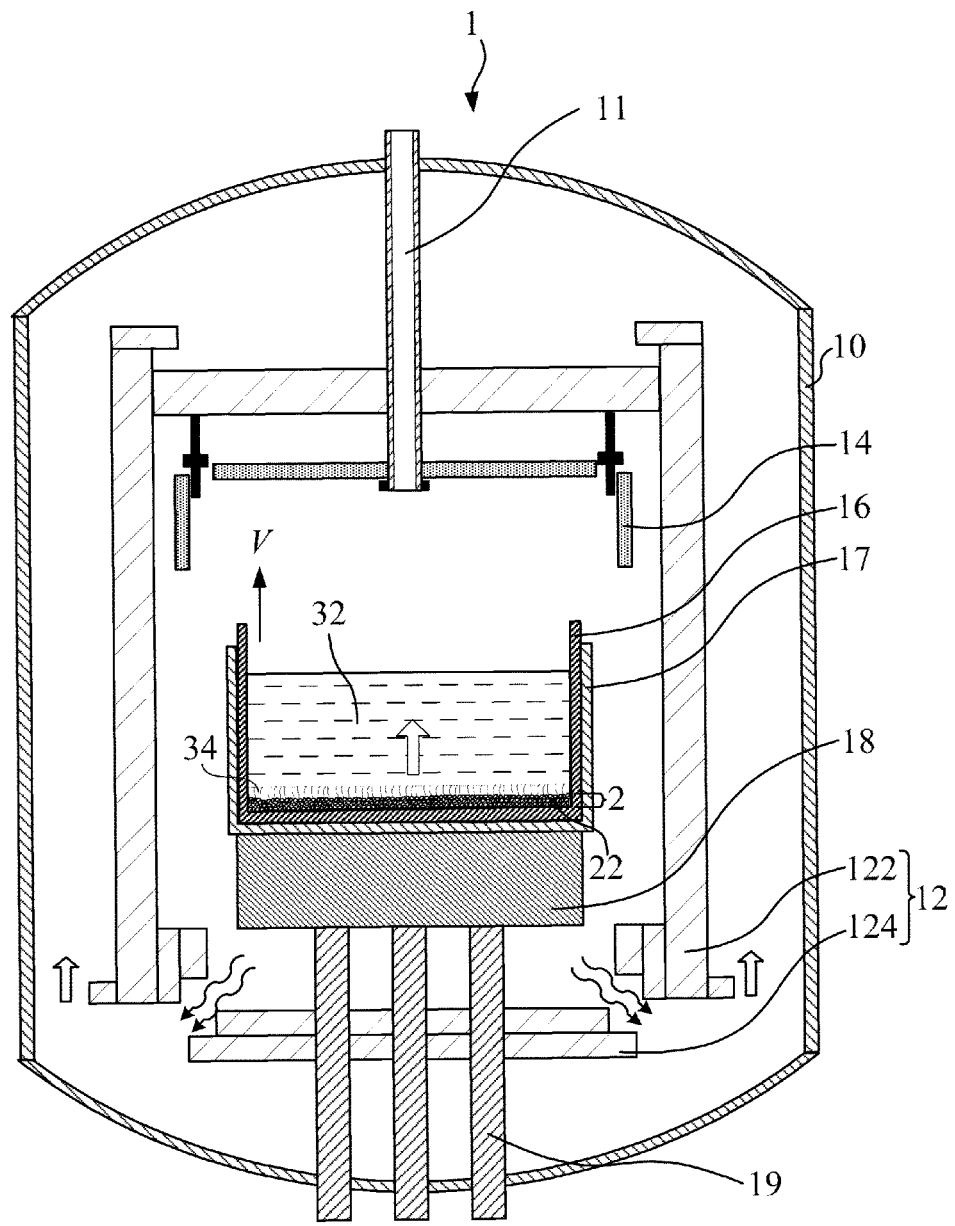

FIGS. 1A-1C are schematically a sectional view of a method for fabricating a crystalline silicon ingot according to one preferred embodiment of the invention.

As shown in FIG. 1A, a crystal growth furnace 1 substantially according to DSS (directional solidification system) (referred to as the "DSS furnace" hereinafter) is employed to carry out the fabricating of the invention. The DSS furnace 1 includes a body 10, a heat insulating cage 12 having an upper insulating cover 122 and a lower insulating plate 124, a directional solidification block 18 within the heat insulating cage 12, at least one support column 19 supporting the directional solidification block 18, a base 17 on the directional solidification block 18, a mold 16 within the base 17, a heater 14 above the mold 16 and an inert gas duct 11 traversing the body 10 and the heat insulating cage 12.

In practice, the mold 16 may be a crucible; both the base 17 and the directional solidification block 18 may be made of graphite; the inert gas duct 11 is configured to introduce argon (Ar) gas into the heat insulating cage 12.

The method of the invention begins with loading a nucleation promotion layer 2 onto the bottom of the mold 16 which defines a vertical direction V, followed by providing a silicon source 30 on the nucleation promotion layer 2 in the mold 16. The mold 16 containing the nucleation promotion layer 2 and the silicon source 30 is placed in the base 17.

Next, the mold 16 is heated until the silicon source 30 is melted down into a silicon melt 32 completely, as shown in FIG. 1B.

Then, at least one thermal control parameter regarding the silicon melt 32 such as heat transfer flux is controlled to enable the nucleation of a plurality of silicon grains 34 from the silicon melt 32 on the nucleation promotion layer 2, and the silicon grains 34 with an average grain size of two to three-fold larger are grown in the vertical direction V, as shown in FIG. 1C. During the crystal growth process, in the DSS furnace 1, as the upper insulating cover 122 moves upward slowly, a gap is thus formed in the closed space secured initially by the heat insulating cage 12. The heat transfer flux will be created since the gap becomes a medium for heat exchange between the inside and the outside of the heat insulating cage 12

As the final step, the at least one thermal control parameter is proceeded to be controlled subsequently for growing the plurality of the silicon grains 34 in the vertical direction V until the silicon melt 32 is solidified completely. Thus is obtained the silicon crystalline ingot.

In one preferred embodiment, the nucleation promotion layer 2 also functions to inhibit the increase of the defect density of the plurality of the silicon grains 34 during the growth process. The defect density's increment rate of thus obtained silicon crystalline ingot in the vertical direction ranges from 0.01%/mm to 10%/mm determined by the following formula:

$$(D_{x2}-D_{x1})/(x2-x1)$$

where x1 and x2 indicate respectively two different levels in the vertical direction of the ingot, and $D_{x1}$ and $D_{x2}$ indicate respectively the defect densities of the ingot in the tangent planes taken at levels x1 and x2.

Even small-sized silicon grains can inhibit the increment rate effectively. In the ingot of the invention, there is a higher possibility for the small-sized silicon grains (<10 mm) to appear in the center of the bottom, while around the side or corner of the bottom of the ingot, only a smaller number of the small-sized silicon grains (<10 mm) appear. It is found that the ratio of area occupied by the small-sized silicon grains in a tangent plane along the vertical direction V affects the growth rate and the increment rate of the defect density of the grains.

In another preferred embodiment, the silicon grains 34 that are immediately adjacent to the nucleation promotion layer 2 have an average grain size of less than about 10 mm.

In still another preferred embodiment, the nucleation promotion layer 2 is composed of a plurality of crystal particles 22 with random geometry, each of which has a grain size of less than about 50 mm.

In further another preferred embodiment, the plurality of the crystal particles 22 may be poly-Si particles, mono-Si particles, single crystal silicon carbide or other crystal particles having a melting point higher than 1400° C. and capable of facilitating nucleation. In particular, the plurality of the crystal particles 22 may be commercially available poly-S or mono-Si chips or chunks that cost much less significantly than the mono-Si seeds. Next, the poly-Si or mono-Si chips or chunks are spread over the bottom of the mold 16 to form a nucleation promotion layer 2 as shown in FIG. 1A. During the process that the silicon source 30 is melted down into the silicon melt 32 completely with the poly-Si or mono-Si chips filled as the nucleation promotion layer 2, as shown in FIG. 1B, the chips are controlled to be partly melted. For preventing the chips from being completely melted, an opening is maintained between the upper insulating cover 122 and the lower insulating plate 124 as shown in FIG. 1B to facilitate the heat dissipation of the lower part of the mold 16.

Figure 2:
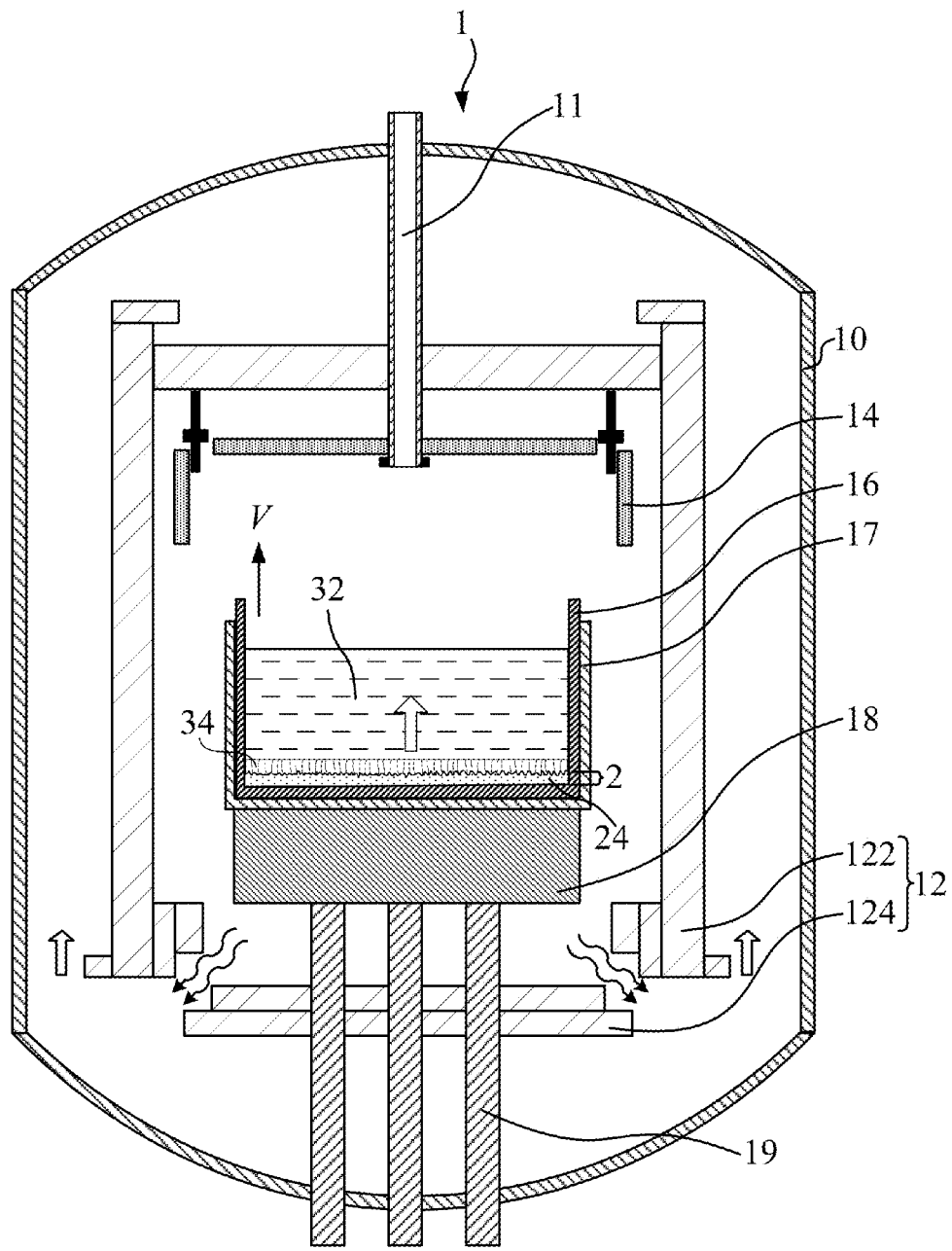
FIG. 2 is a sectional view of a DSS crystal growth furnace according to one preferred embodiment of the invention in which a nucleation promotion layer loaded on the bottom of a mold is a plate.

In yet another preferred embodiment, as shown in FIG. 2, the nucleation promotion layer 2 may be a plate 24 made of a material having a melting point higher than about 1400° C. such as high purity graphite, silicon, or ceramic materials like aluminum oxide, silicon carbide, silicon nitride, aluminum nitride. The interface between the plate 24 and the silicon melt 32 has a roughness of 300 m to 1000 m to provide multiple nucleation sites for the plurality of the silicon grains 34. Particularly, like reference numerals in FIG. 2 indicate like parts in FIG. 1C having substantially the same structure and function.

Referring back to FIGS. 1A-1C, the heater 14 is located above the mold 16, and the directional solidification block 18 is located below and in indirect contact with the mold 16. The thermal control parameters may be, for example, a first temperature gradient from the heater 14 to the mold 16, a second temperature gradient from the bottom of the silicon melt 20 to the top of the directional solidification block 18, or a heat transfer flux. In practice, the first temperature gradient has to be controlled below 0.4° C./cm, which could be achieved by for example increasing the distance from the heater 14 to the mold 16 or controlling the heater 14 at the set point of less than 1410° C. The second temperature gradient has to be controlled above 17° C./cm, which could be achieved by for example increasing the thickness of the directional solidification block 18. Also, the heat transfer flux has to be controlled larger than 37000 W/m² by for example adjusting the rising speed of the upper insulating cover 122 to 3 cm/hr or more.

In one preferred embodiment, the method of fabricating the crystalline silicon ingot is disclosed as follows. First, a nucleation promotion layer 2 is loaded onto the bottom of the mold 16. The nucleation promotion layer 2 is formed by jointing multiple crystal particles 22 with random geometry. The mold 16 itself defines a vertical direction V. In practice, the nucleation promotion layer 2 is obtained by cutting the lower part of another crystalline silicon ingot fabricated with the method of the invention. In this way, the nucleation promotion layer 2 may be recovered for subsequent uses.

Next, a silicon source 30 is provided in the mold 16 and placed on the nucleation promotion layer 2.

Afterwards, the mold 16 is heated until the silicon source 30 is melted completely into a silicon melt 32. Subsequently, at least one thermal control parameter regarding the silicon melt 32 is controlled to enable the nucleation of a plurality of silicon grains 34 from the silicon melt 32 on the nucleation promotion layer 2 such that a final average grain size of silicon grains grown in the vertical direction V is about two to three-fold of an initial average grain size grown. At last, the at least one thermal control parameter is proceeded to be controlled for growing the plurality of the silicon grains 34 in the vertical direction V until the silicon melt 32 is solidified completely. Thus is obtained the silicon crystalline ingot.

In one preferred embodiment, the nucleation promotion layer 2 also functions to inhibit the increase of the defect density of the plurality of the silicon grains 34 during the growth process. The defect density's increment rate of thus obtained silicon crystalline ingot in the vertical direction ranges from 0.01%/mm to 10%/mm.

In another preferred embodiment, the silicon grains 34 that are immediately adjacent to the nucleation promotion layer 2 have an average grain size of less than about 10 mm.

In still another preferred embodiment, the nucleation promotion layer 2 is composed of a plurality of crystal particles 22 with random geometry, each of which has a grain size of less than about 50 mm.

The crystalline silicon ingot of the invention includes a plurality of silicon grains growing in a vertical direction and a nucleation promotion layer. Also, in the ingot, the silicon grains 34 those are immediately adjacent to the nucleation promotion layer 2 have an average grain size of less than about 10 mm. Further, the defect density's increment rate of thus obtained silicon crystalline ingot in the vertical direction ranges from 0.01%/mm to 10%/mm.

In one preferred embodiment, the nucleation promotion layer 2 is composed of a plurality of crystal particles 22 with random geometry, each of which has a grain size of less than about 50 mm.

In another preferred embodiment, the plurality of the crystal particles 22 may be poly-Si particles, mono-Si particles, single crystal silicon carbide or other crystal particles having a melting point higher than 1400° C. and capable of facilitating nucleation.

In yet another preferred embodiment, the nucleation promotion layer may be a plate made of a material having a melting point higher than about 1400° C. such as high purity graphite, silicon, or ceramic materials like aluminum oxide, silicon carbide, silicon nitride, aluminum nitride. The interface between the plate and the silicon melt has a roughness of 300 m to 1000 m to provide multiple nucleation sites for the plurality of the silicon grains.

Figure 3:
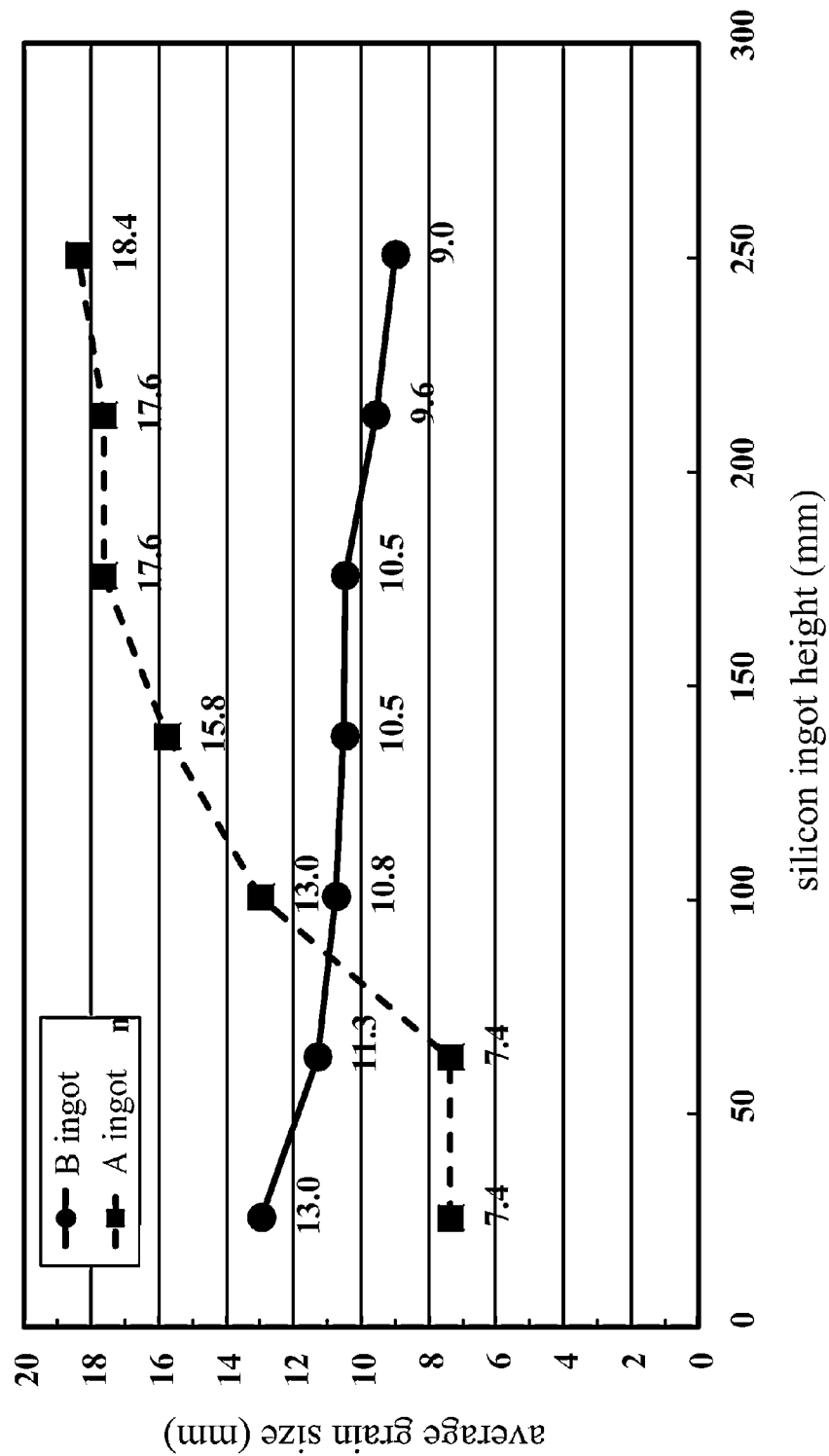
FIG. 3 is a diagram comparing the grain size of the silicon grains fabricated according to one preferred embodiment of the invention and the conventional method.
Figure 4:
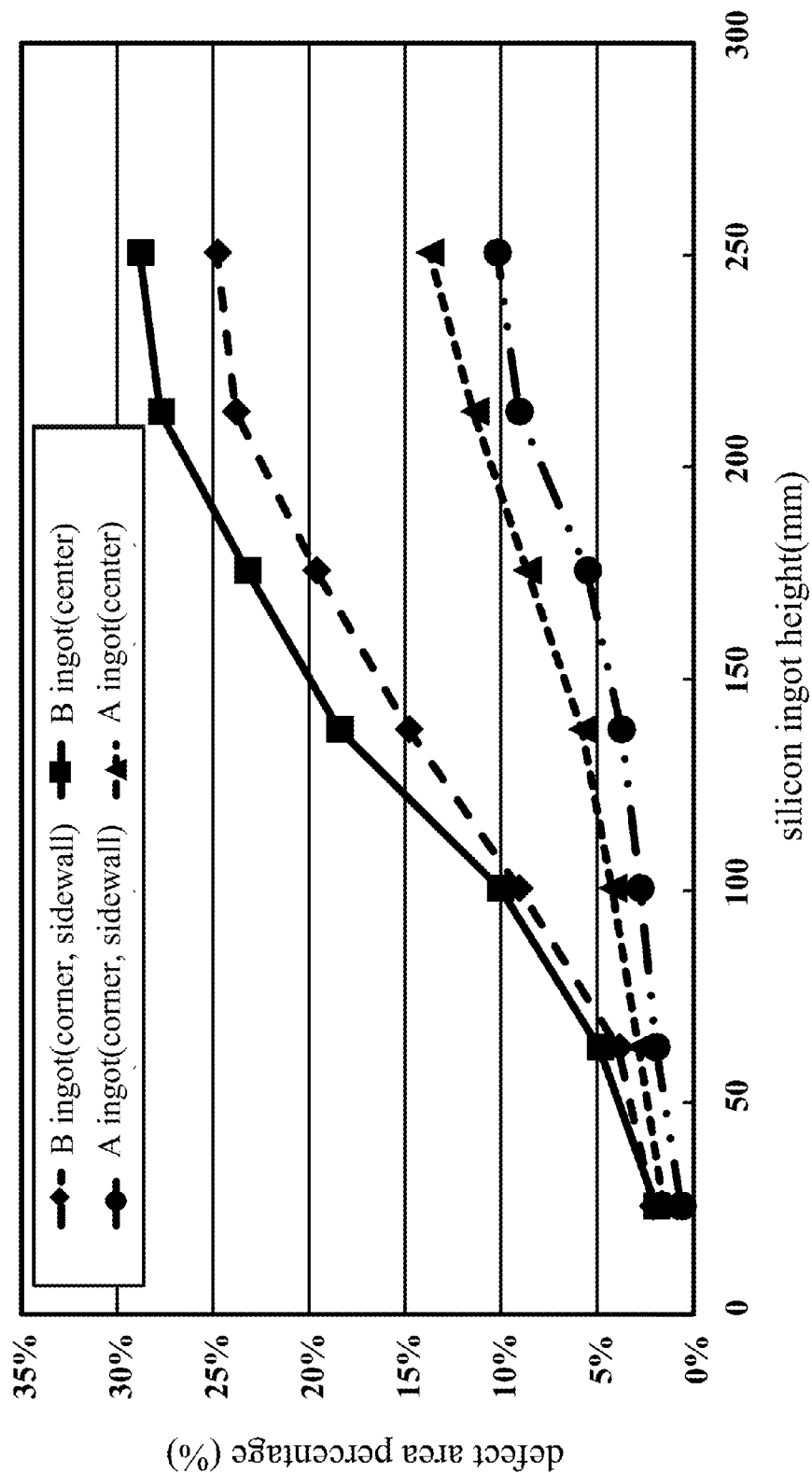
FIG. 4 is a diagram comparing the defect density of the silicon grains fabricated by one preferred embodiment of the invention and the conventional method.

FIGS. 3 and 4 are respectively diagrams showing the relationships of the average grain size and the defect density (in defect area ratio, %) with respect to the level of the ingot between the crystalline silicon ingot A of one preferred embodiment and the crystalline silicon ingot B fabricated by the conventional method. From data for ingot A in FIG. 3, it is noted that the average grain size during initial stage is about 7.4 mm, and the average grain size during final stage is about 18.4 mm. Therefore the final average grain size is about 2.49 (=18.4/7.4) of the initial average grain size, which is between 2 and 3. FIG. 4 particularly shows the defect area ratios around the corner, sidewall, and center of both the ingots A and B.

Figure 5:
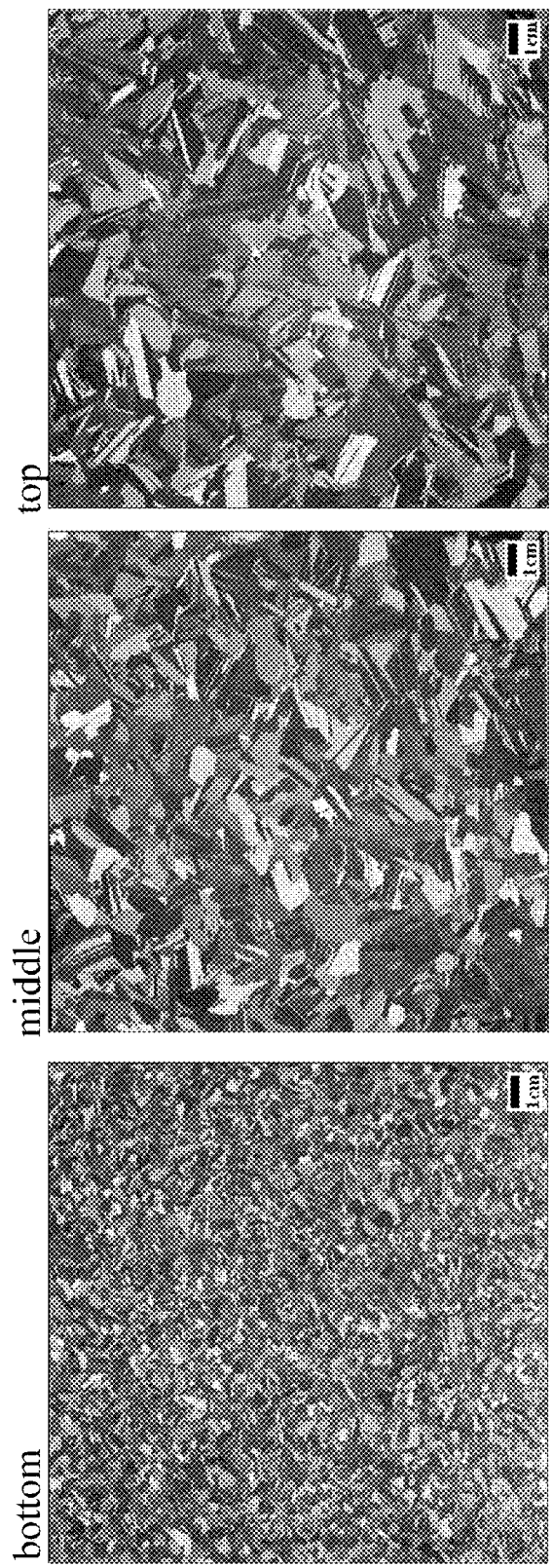
FIG. 5 is a metallograph regarding the grain size at the bottom, middle, and top of the crystalline silicon ingot of one preferred embodiment.
Figure 6:
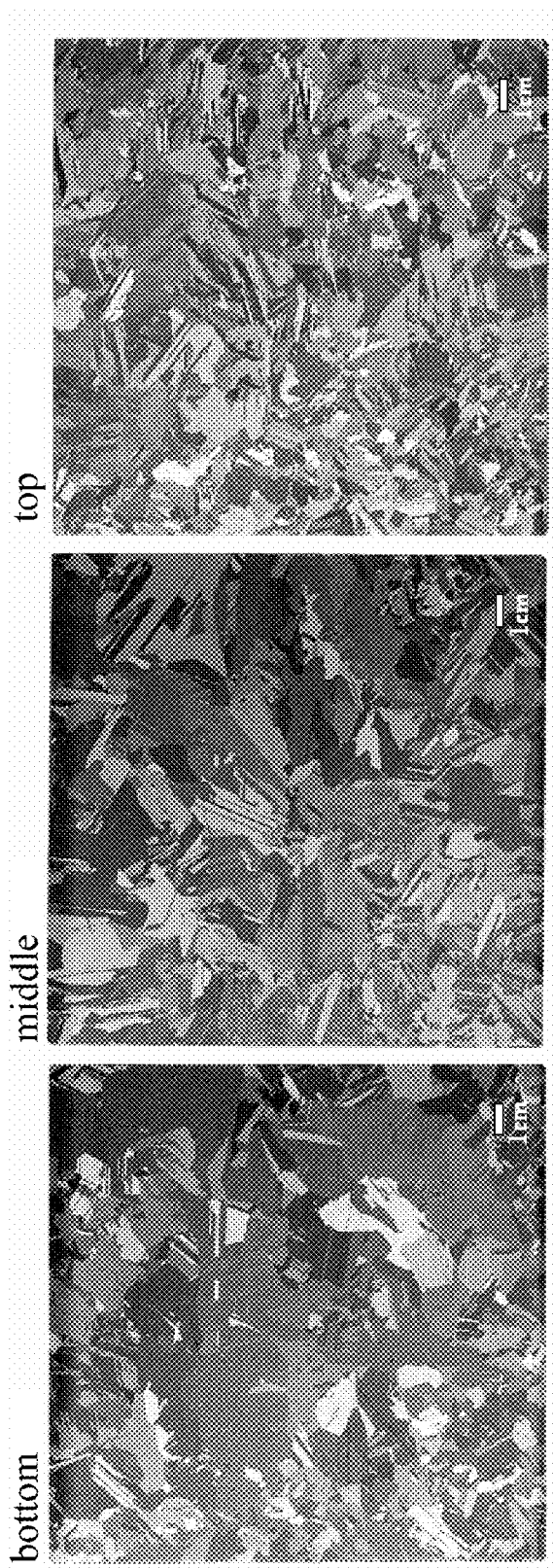
FIG. 6 is a metallograph regarding the grain size at the bottom, middle, and top of the conventional crystalline silicon ingot.

FIG. 5 is a metallograph of the grain size at the bottom, middle, and top (about 250 mm vertically away from the bottom) of the ingot A of one preferred embodiment, while FIG. 6 is a metallograph of the grain size at the bottom, middle, and top (about 250 mm vertically away from the bottom) of the ingot B. The ingots A and B in the case have a height of 250 mm.

Figure 7:
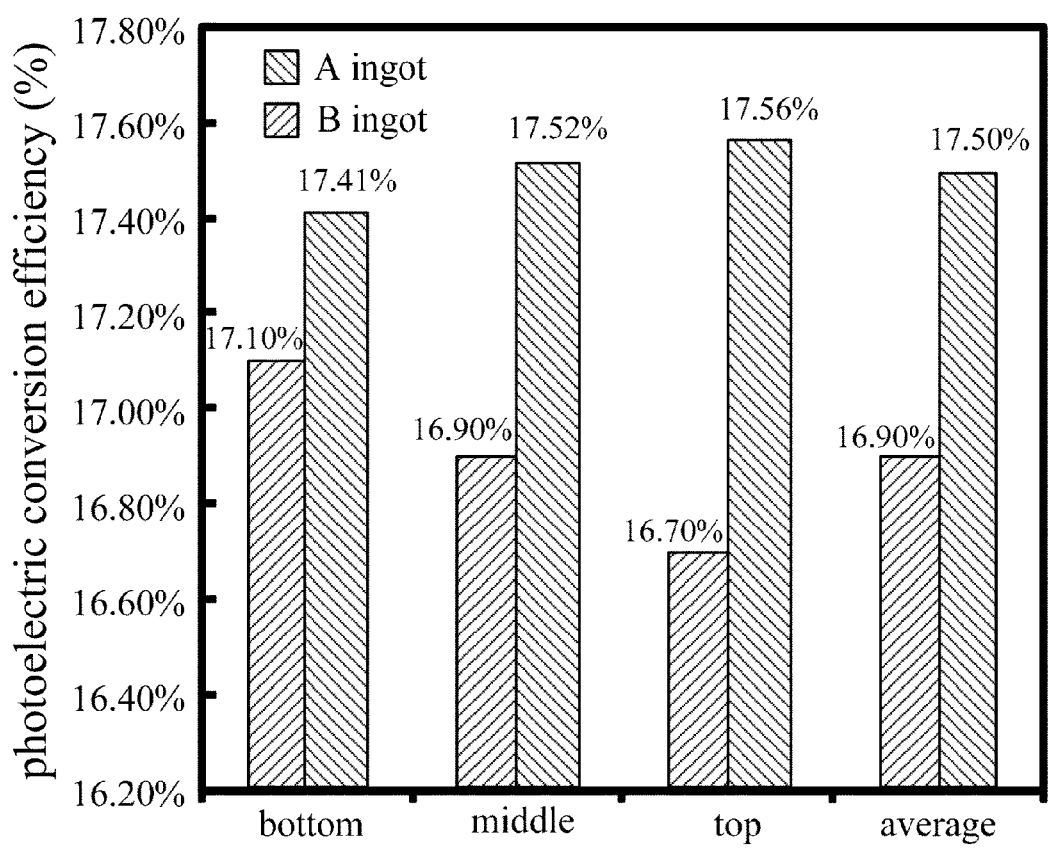
FIG. 7 is a bar graph showing the photoelectric conversion efficiency of the solar cell made from the bottom, middle, and top (about 250 mm vertically away from the bottom) of the ingots A (of one preferred embodiment) and B (conventional one) for comparison.

FIG. 7 is a bar graph showing the photoelectric conversion efficiency of the solar cell made from the bottom, middle, and top (about 250 mm vertically away from the bottom) of the ingots A and B for comparison. As shown in FIG. 7, the photoelectric conversion efficiency of the solar cell made from the ingot A ranging from 17.41%-17.56% is higher than that made from the ingot B ranging from 16.70%-17.10% by about 0.6%. Besides, the solar cells made from the bottom, middle, and top of the ingot have relatively approximate photoelectric conversion efficiencies, which is of great commercial value and beneficial to the cell manufacturer.

It is obvious from FIGS. 3-7 that for the ingot B, the silicon grains are large and have lower defect density at the bottom of the crucible, whereas the defect density increases rapidly as the silicon grains proceed to grow. Hence, the crystalline silicon ingot thus obtained has a poor quality on the whole, and the photoelectric conversion efficiency of the solar cell made therefrom is lower without doubt. On the contrary, in fabricating the ingot A, the nucleation promotion layer is introduced as effective and dense nucleation sites for the silicon melt to significantly diminish the distribution ratio of the large-sized silicon grains. Since the competition is much less frequently occurred between small-sized grains during the growth process, and small-sized grains tend to grow upward in a generally single direction due to great denseness in grain population, the situation that the small-sized grains are overwhelmed by the large-sized grains is effectively reduced so that the columnar crystals are allowed to grow completely. In addition, during the growth of the crystals, the grain boundaries distributed densely in the ingot A contribute to concentrate defects by stress field, or the defects can slip on the grain boundaries to release thermal stress. Accordingly, the increase of defects such as dislocation is hindered effectively, thereby leading to a better quality of the entire crystalline silicon ingot and a higher photoelectric conversion efficiency of the solar cell made therefrom.

From the above description of the invention, it is manifest that various techniques can be used for implementing the concepts of the invention without departing from the scope thereof. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It is intended that the scope of the invention is defined by the appended claims.

What is claimed is:

1. A poly-crystalline silicon ingot having a bottom and defining a vertical direction, comprising:
   a plurality of silicon grains grown in the vertical direction, in which the plurality of the silicon grains have at least three crystal orientations; and a nucleation promotion layer comprising a plurality of chips and chunks of poly-crystalline silicon on the bottom, wherein an average grain size of the plurality of the silicon grains increases progressively from an upper surface of the nucleation promotion layer in the vertical direction.

2. The crystalline silicon ingot according to claim 1, wherein the chips and chunks of poly-crystalline silicon have a grain size of less than 50 mm.

3. The poly-crystalline silicon ingot according to claim 1, wherein a final average grain size of the plurality of the silicon grains in the vertical direction is two to three-fold of an initial average grain size grown.

4. The poly-crystalline silicon ingot according to claim 1, wherein the poly-crystalline silicon ingot has an average grain size of the silicon grains of 7.4 mm to 13 mm at a height of 50-100 mm from the bottom.

5. The poly-crystalline silicon ingot according to claim 1, wherein the poly-crystalline silicon ingot has a defect density of less than 10% at a height below 150 mm from the bottom.

6. The poly-crystalline silicon ingot according to claim 1, wherein the plurality of the silicon grains that are immediately adjacent to the nucleation promotion layer have an average grain size of less than 10 mm.

7. The poly-crystalline silicon ingot of claim 1, wherein the nucleation promotion layer is a continuous layer.

8. A poly-crystalline silicon ingot having a bottom and defining a vertical direction, comprising:

a plurality of silicon grains grown in the vertical direction; and a nucleation promotion layer comprising a continuous layer of a plurality of poly-crystalline silicon chips and chunks on the bottom, wherein the silicon grains that are adjacent to the nucleation promotion layer have an average grain size of less than 10 mm.

9. The poly-crystalline silicon ingot according to claim 8, wherein the plurality of poly-crystalline silicon chips and chunks have a grain size of less than 50 mm.

10. The poly-crystalline silicon ingot according to claim 8, wherein an increment rate of defect density of the silicon crystalline silicon ingot in the vertical direction ranges from 0.01%/mm to 10%/mm.

11. The poly-crystalline silicon ingot according to claim 8, wherein the plurality of the silicon grains have at least three crystal orientations.

12. A poly-crystalline silicon ingot having a bottom and defining a vertical direction, comprising:

a plurality of silicon grains grown in the vertical direction; and a nucleation promotion layer comprising a layer of a plurality of poly-crystalline silicon chips and chunks on the bottom, wherein the silicon grains that are adjacent to the nucleation promotion layer have an average grain size of less than 10 mm.

13. The poly-crystalline silicon ingot of claim 12, wherein the nucleation promotion layer is a continuous layer.

14. The poly-crystalline silicon ingot according to claim 12, wherein the plurality of poly-crystalline silicon chips and chunks have a grain size of less than 50 mm.

15. The poly-crystalline silicon ingot according to claim 12, wherein the plurality of the silicon grains have at least three crystal orientations.

* * * * *